United States Patent
Takigawa (10) Patent No.: US 7,811,936 B2
(45) Date of Patent: Oct. 12, 2010

(54) METHOD OF PRODUCING SEMICONDUCTOR DEVICE

(75) Inventor: Yukio Takigawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/023,404

(22) Filed: Jan. 31, 2008

(65) Prior Publication Data

US 2008/0166872 A1    Jul. 10, 2008

Related U.S. Application Data

(63) Continuation of application No. PCT/JP2005/014661, filed on Aug. 10, 2005.

(51) Int. Cl.
  *H01L 21/302* (2006.01)
  *H01L 21/461* (2006.01)
(52) U.S. Cl. .............................. 438/689; 257/E21.228
(58) Field of Classification Search ................ 438/637, 438/689; 257/E21.228
  See application file for complete search history.

(56) References Cited

U.S. PATENT DOCUMENTS

| | | | | |
|---|---|---|---|---|
| 5,977,041 | A * | 11/1999 | Honda | 510/175 |
| 5,990,060 | A * | 11/1999 | Ohmi et al. | 510/175 |
| 6,550,988 | B2 | 4/2003 | Sugimoto et al. | |
| 6,743,301 | B2 | 6/2004 | Matsuno et al. | |
| 6,943,115 | B2 * | 9/2005 | Horiuchi et al. | 438/692 |
| 6,949,465 | B2 * | 9/2005 | Aoki et al. | 438/689 |
| 6,983,756 | B2 | 1/2006 | Matsuno et al. | |
| 7,071,116 | B2 * | 7/2006 | Yasuda | 438/751 |
| 2003/0087524 | A1 * | 5/2003 | Aoki et al. | 438/691 |
| 2006/0054181 | A1 * | 3/2006 | Rayandayan et al. | 134/1 |
| 2007/0000519 | A1 * | 1/2007 | Jacobson et al. | 134/21 |

FOREIGN PATENT DOCUMENTS

| | | |
|---|---|---|
| JP | 10-244263 A | 9/1998 |
| JP | 2001185520 A | 7/2001 |
| JP | 200359894 A | 2/2003 |
| JP | 2003103228 A | 4/2003 |
| JP | 2003-313594 A | 11/2003 |
| JP | 2004-96055 A | 3/2004 |
| JP | 2004-273961 A | 9/2004 |

OTHER PUBLICATIONS

International Search Report of PCT/JP2005/014661, date of mailing Nov. 15, 2005.
Japanese Office Action dated Apr. 6, 2010, issued in corresponding Japanese Patent Application No. 2007-529436.

* cited by examiner

*Primary Examiner*—W. David Coleman
*Assistant Examiner*—Christine Enad
(74) *Attorney, Agent, or Firm*—Westerman, Hattori, Daniels & Adrian, LLP (57) ABSTRACT

A method produces a semiconductor device having an interconnection structure disposed above a substrate, wherein the interconnection structure has an interconnection and an insulator layer including a low-permittivity layer. The method includes an etching step forming openings in the insulator layer to expose a surface of the interconnection by dry etching, a cleaning step cleaning the surface of the interconnection and the openings in the insulator layer, and a forming step forming another interconnection by filling a conductor material into the openings. The cleaning step includes a first cleaning process using a cleaning liquid, a rinsing process using a rinsing liquid including water and carbonic acid or organic acid, and a second cleaning process using a neutral or alkaline hydrogen aqueous solution that is supplied to the surface of the interconnection and the openings in the insulator layer.

11 Claims, 9 Drawing Sheets

| | RESISTIVITY (MΩ·cm) OF CARBON DIOXIDE AQUEOUS SOLUTION | pH OF HYDROGEN AQUEOUS SOLUTION | NUMBER OF FOREIGN PARTICLES | DAMAGE TO INTERCONNECTION PATTERN | VIA CHAIN YIELD (%) | NOTE |
|---|---|---|---|---|---|---|
| Emb1 | 0.01 | 8.0 | 0 | NONE | 100 | |
| Emb2 | 0.5 | 8.0 | 0 | NONE | 100 | |
| Emb3 | 1.0 | 8.0 | 0 | NONE | 100 | |
| Cmp1 | 2.1 | 8.0 | 0 | NONE | 80 | |
| Emb4 | 0.01 | 7.0 | 0 | NONE | 100 | |
| Emb5 | 0.01 | 9.8 | 0 | NONE | 100 | |
| Cmp2 | 0.01 | 6.0 | 5 | NONE | 60 | |
| Cmp3 | 0.01 | 11.0 | 0 | NONE | 50 | |
| Cmp4 | 0.01 | — | 30 | YES | 5 | TWO-FLUID CLEANING |
| Emb6 | 0.01 | 8.0 | 0 | NONE | 100 | |
| Cmp5 | 0.01 | — | 24 | YES | 7 | TWO-FLUID CLEANING |

FIG.13

| | RESISTIVITY (MΩ·cm) OF CARBON DIOXIDE AQUEOUS SOLUTION | pH OF HYDROGEN AQUEOUS SOLUTION | NUMBER OF FOREIGN PARTICLES | DAMAGE TO INTERCONNECTION PATTERN | VIA CHAIN YIELD (%) | NOTE |
|---|---|---|---|---|---|---|
| Emb7 | 0.01 | 8.0 | 0 | NONE | 100 | |
| Emb8 | 0.5 | 8.0 | 0 | NONE | 100 | |
| Emb9 | 1.0 | 8.0 | 0 | NONE | 100 | |
| Emb10 | 0.01 | 7.0 | 0 | NONE | 100 | |
| Emb11 | 0.01 | 9.8 | 0 | NONE | 100 | |
| Cmp6 | 0.01 | — | 30 | YES | 5 | TWO-FLUID CLEANING |
| Emb12 | 0.01 | 8.0 | 0 | NONE | 100 | |
| Cmp7 | 0.01 | — | 25 | YES | 7 | TWO-FLUID CLEANING |

FIG.14

| | RESISTIVITY (MΩ·cm) OF CARBON DIOXIDE AQUEOUS SOLUTION | pH OF HYDROGEN AQUEOUS SOLUTION | NUMBER OF FOREIGN PARTICLES | DAMAGE TO INTERCONNECTION PATTERN | VIA CHAIN YIELD (%) | NOTE |
|---|---|---|---|---|---|---|
| Emb13 | 0.01 | 8.0 | 0 | NONE | 100 | |
| Emb14 | 0.5 | 8.0 | 0 | NONE | 100 | |
| Emb15 | 1.0 | 8.0 | 0 | NONE | 100 | |
| Emb16 | 0.01 | 7.0 | 0 | NONE | 100 | |
| Emb17 | 0.01 | 9.8 | 0 | NONE | 100 | |
| Cmp8 | 0.01 | — | 20 | YES | 4 | TWO-FLUID CLEANING |

FIG.15

| | RESISTIVITY (MΩ·cm) OF CARBON DIOXIDE AQUEOUS SOLUTION | pH OF HYDROGEN AQUEOUS SOLUTION | NUMBER OF FOREIGN PARTICLES | DAMAGE TO INTERCONNECTION PATTERN | VIA CHAIN YIELD (%) | NOTE |
|---|---|---|---|---|---|---|
| Emb18 | 0.01 | 8.0 | 0 | NONE | 100 | |
| Emb19 | 0.5 | 8.0 | 0 | NONE | 100 | |
| Emb20 | 1.0 | 8.0 | 0 | NONE | 100 | |
| Emb21 | 0.01 | 7.0 | 0 | NONE | 100 | |
| Emb22 | 0.01 | 9.8 | 0 | NONE | 100 | |
| Emb23 | 0.01 | 9.8 | 0 | NONE | 100 | NO ULTRASONIC WAVE APPLIED |
| Cmp9 | 0.01 | — | 40 | YES | 0 | TWO-FLUID CLEANING |
| Emb24 | 0.01 | 8.0 | 0 | NONE | 100 | |
| Cmp10 | 0.01 | — | 40 | YES | 0 | TWO-FLUID CLEANING |

METHOD OF PRODUCING SEMICONDUCTOR DEVICE

CROSS-REFERENCE TO RELATED APPLICATIONS

This application is a continuation application filed under 35 U.S.C. 111(a) claiming the benefit under 35 U.S.C. 120 and 365(c) of a PCT International Application No. PCT/JP2005/014661 filed Aug. 10, 2005, in the Japanese Patent Office, the disclosure of which is hereby incorporated by reference.

BACKGROUND OF THE INVENTION

1. Field of the Invention

The present invention generally relates to methods of producing or fabricating semiconductor devices, and more particularly to a method of producing a semiconductor device having multi-level interconnection structure (or multi-layer wiring structure).

2. Description of the Related Art

As the integration density and the performance of semiconductor devices improve, there are demands to improve the speed of signals transferred via interconnections. The so-called RC delay is one cause of the signal delay. The RC delay is the signal delay that occurs proportionally to a product RC of an interconnect resistance R and a capacitance C between interconnections. In order to reduce the interconnect resistance R, the interconnection material has changed from Al to copper (Cu) which has a lower resistivity. The so-called damascene process has been employed to form the interconnection structure using Cu. The damascene process forms via holes and interconnection grooves in an interlayer insulator layer by dry etching, and fills the Cu material into the via holes and the interconnection grooves by plating.

The dry etching chemically or physically removes the interlayer insulator layer such as a silicon oxide layer. However, the residue (or reaction product) that is generated when removing the interlayer insulator layer adheres on the surfaces of the interconnection grooves and the inner walls of the via holes. In addition, the interlayer insulator layer that is removed by the dry etching and the residue are deposited on the inner walls of a dry etching apparatus. Such deposits cure and become sick when exposed to plasma, and may separate during the dry etching process and become foreign particles that adhere on the wafer surface. Unless such foreign particles including the residue are sufficiently removed by surface cleaning, the interconnect resistance R will increase.

For this reason, the residue is removed by wet cleaning. The wet cleaning combines a chemical process that uses cleaning agents, acids, alkali chemicals and the like, and a physical process, such as the two-fluid cleaning, which causes a physical removal by applying ultrasonic waves or by accelerating and spraying a mist of pure water by nitrogen. In addition, techniques for removing the residue and the like using special-purpose water in which zone or hydrogen is dissolved are proposed in Japanese Laid-Open Patent Applications No. 2004-273961 and No. 2004-096055, for example.

Due to the increased integration density of semiconductor devices, the size of via holes and interconnections has become extremely small. For this reason, if a residue of a resist or the residue of the dry etching remains within the via holes and the interconnection grooves, the interconnection resistance R increases and a disconnection of the interconnection is more easily generated. Hence, there are demands to improve the cleaning performance of the wet cleaning.

On the other hand, in order to reduce the CR delay, proposals have been made to use for the interlayer insulator layer a material having a low permittivity compared to that of the conventionally used silicon oxide. However, the interlayer insulator layer (or low-permittivity layer) made of the material having the low permittivity or, low-k material, has a mechanical strength lower than that of the conventionally used silicon oxide layer, and if the two-fluid cleaning described above is used for the wet etching, the via holes and the interconnection grooves are easily damaged. Therefore, although there are demands to improve the performance of the wet cleaning, it is becoming more difficult to employ a physical cleaning technique having a large impact force, such as the two-fluid cleaning.

SUMMARY OF THE INVENTION

According to one aspect of an embodiment of the present invention, there is provided a method of producing a semiconductor device having an interconnection structure disposed above a substrate, the interconnection structure comprising an interconnection and an insulator layer including a low-permittivity layer, the method comprising an etching step forming openings in the insulator layer to expose a surface of the interconnection by dry etching; a cleaning step cleaning the surface of the interconnection and the openings in the insulator layer; and a forming step forming another interconnection by filling a conductor material into the openings, the cleaning step including a first cleaning process using a cleaning liquid; a rinsing process using a rinsing liquid including water and carbonic acid or organic acid; and a second cleaning process using a neutral or alkaline hydrogen aqueous solution that is supplied to the surface of the interconnection and the openings in the insulator layer.

According to one aspect of an embodiment of the present invention, it is possible to form an oxide layer on the surface of the interconnection and cause passivation to thereby suppress elution of the interconnection material, by supplying in the rinsing step a rinsing liquid which includes water and carbonic acid or organic acid. By supplying the neutral or alkaline hydrogen aqueous solution in the second cleaning process, it is possible to remove the foreign particles and reduce the oxide film on the interconnection surface to the metal state. The foreign particles include residue generated by the dry etching and adhered on surfaces defining the openings, and micro particles deposited on inner walls of an etching chamber of an etching apparatus and adhered on the surface of the semiconductor device. Hence, it is possible to clean the surfaces of the openings through which the low-permittivity layer is exposed, while suppressing damage to the surfaces. Therefore, the production yield is improved, and the disconnection or short-circuiting of the interconnection after long period of use is prevented. In other words, it is possible to produce semiconductor devices capable of performing high-speed operations and having a high reliability.

DESCRIPTION OF THE PREFERRED EMBODIMENTS

A description will now be given of embodiments of the present invention, by referring to the drawings.

An embodiment of a method of producing semiconductor device according to the present invention employs the dual damascene process to form a multi-level interconnection structure (or multi-layer wiring structure). A low-k material having a low permittivity is used for the interlayer insulator layer, that is, a low-k layer, of the multi-level interconnection structure.

FIGS. 1 through 8 are cross sectional views for explaining processes of this embodiment of the method of producing semiconductor device according to the present invention.

Figure 1:
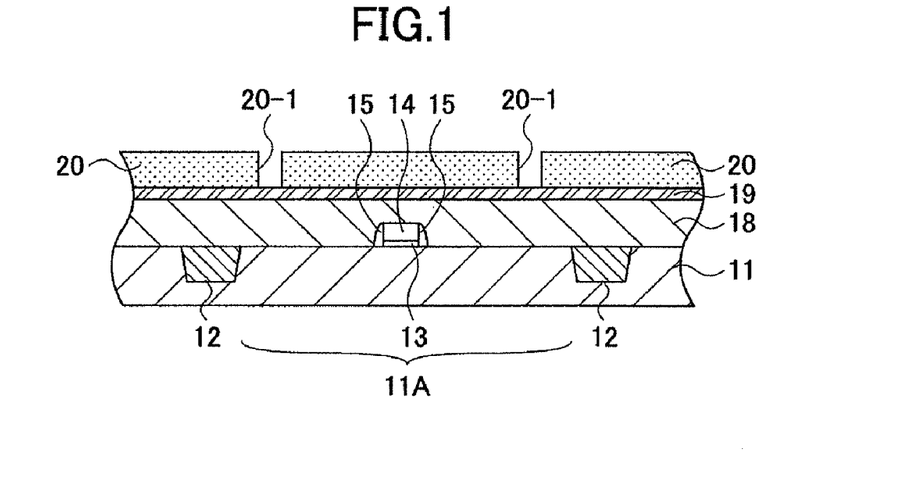
FIG. 1 is a cross sectional view for explaining a process of an embodiment of a method of producing semiconductor device according to the present invention.

First, a description will be given of the process shown in FIG. 1. In FIG. 1, a device region 11A on a surface of a p-type silicon (Si) substrate (or wafer) 11 is partitioned by a shallow trench isolation (STI) type isolation structure 12. A gate insulator layer 13 and a gate electrode 14 are stacked on the device region 11A. An impurity region (not shown) is formed in the Si substrate 11 on both sides of the gate insulator layer 13, and a sidewall insulator layer 15 is formed on both sides of the gate electrode 14. As a result, a metal oxide semiconductor (MOS) transistor is formed. Of course, the present invention is not limited to the formation of the MOS transistor, and the present invention is similarly applicable to the formation of other semiconductor devices such as diodes and bipolar transistors.

In the process shown in FIG. 1, an insulator layer 18 is further formed to cover the surface of the Si substrate 11, the gate electrode 14 and the sidewall insulator layer 15. For example, a chemical vapor deposition (CVD) is carried out at a substrate temperature of 600° C. to form a phosphosilicate glass (PSG) layer, as the insulator layer 18, to a thickness of approximately 1.5 μm. Furthermore, a chemical mechanical polishing (CMP) is carried out to planarize the surface of the PSG insulator layer 18.

Moreover, in the process shown in FIG. 1, a passivation layer 19 is formed on the PSG insulator layer 18. For example, a plasma CVD is carried out to form a carbon silicide (SiC) layer, as the passivation layer 19, to a thickness of approximately 50 nm using the ESLS (registered trademark, manufactured by Novellus Systems, Inc.). The SiC passivation layer 19 that is formed is hydrophobic. The SiC passivation layer 19 also has a function of preventing Cu of a Cu interconnection that is formed thereon from diffusing underneath.

Further, in the process shown in FIG. 1, a resist layer 20 is formed on the SiC passivation layer 19, and openings 20-1 are formed in the resist layer 20 by a photolithography technique, at positions where contact holes are to be formed in a later process.

Figure 2:
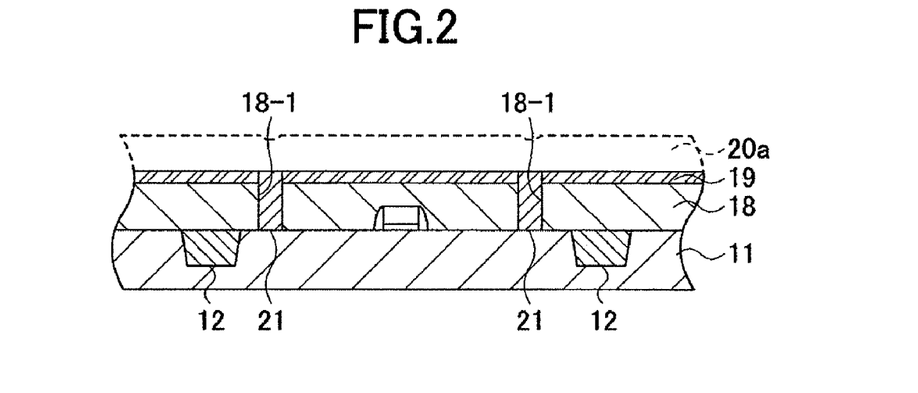
FIG. 2 is a cross sectional view for explaining a process of the embodiment of the method of producing semiconductor device according to the present invention.

Next, in the process shown in FIG. 2, the SiC passivation layer 19 and the PSG insulator layer 18 are etched using the resist layer 20 as a mask, so as to expose the surface of the Si substrate 11 and form contact holes 18-1. The resist layer 20 is then removed.

In addition, in the process shown in FIG. 2, a barrier metal layer (not shown), which is made of titanium nitride (TiN), tantalum (Ta) or the like, is deposited by sputtering so as to cover the surface of the Si substrate 11 and the inner walls of the contact holes 18-1. Moreover, a tungsten (W) layer 20a is formed by CVD, so as to fill the insides of the contact holes 18-1. Furthermore, the W layer 20a and the barrier metal layer which are deposited on the SiC passivation layer 19 are removed by CMP. As a result, contacts 21 are formed.

Figure 3:
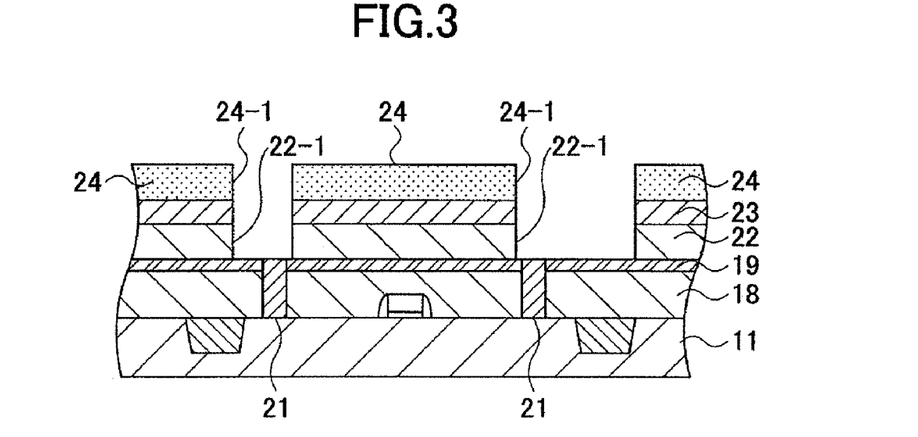
FIG. 3 is a cross sectional view for explaining a process of the embodiment of the method of producing semiconductor device according to the present invention.

Next, in the process shown in FIG. 3, an interlayer insulator layer 22 made of a low-k material is formed on the SiC passivation layer 19 by coating to a thickness of approximately 150 nm, for example, using SiLK (registered trademark)-J150 (product name, manufactured by The Dow Chemical Company). The interlayer insulator layer 22 is baked after the coating so as to evaporate the solvent, and is then cured by a thermal process.

In addition, in the process shown in FIG. 3, a CVD is carried out to form a silicon oxide (SiO) layer, as a cap layer 23, on the interlayer insulator layer 22 to a thickness of approximately 100 nm, for example.

Moreover, in the process shown in FIG. 3, a resist layer 24 is formed on the SiO cap layer 23, and openings 24-1 are formed in the resist layer 24 by a photolithography technique, at positions where interconnection grooves are to be formed in a later process. Furthermore, the SiO cap layer 23 and the interlayer insulator layer 22 are etched by dry etching using the resist layer 24 as a mask, so as to expose the surface of the contacts 21 and form interconnection (or wiring) grooves 22-1.

Figure 4:
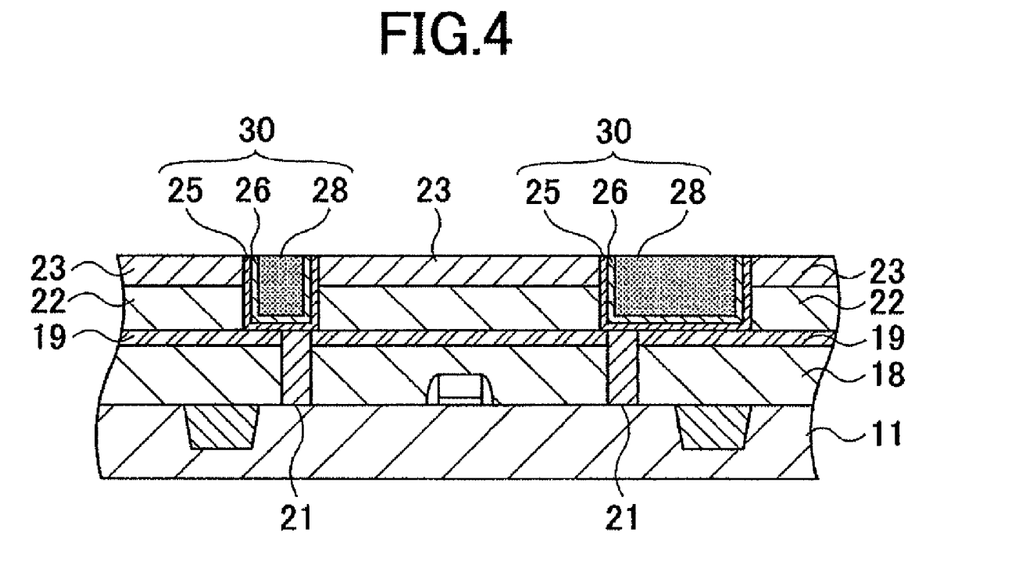
FIG. 4 is a cross sectional view for explaining a process of the embodiment of the method of producing semiconductor device according to the present invention.

Next, in the process shown in FIG. 4, the resist layer 24 shown in FIG. 3 is removed. Then, a barrier metal layer 25 made of tantalum nitride (TaN) is formed by sputtering to a thickness of approximately 30 nm and a seed metal layer 26 made of Cu is formed by sputtering to a thickness of approximately 30 nm, for example, on the exposed surface of the contacts 21 of the interconnection grooves 22-1.

In addition, in the process shown in FIG. 4, a Cu layer 28 is formed on the seed metal layer 26 by electroplating. In addition, the Cu layer 28, the seed metal layer 26 and the barrier metal layer 25 on the surface of the cap layer 23 are removed by CMP. Consequently, a first interconnection (or wiring) 30 is formed. Of course, a Cu alloy layer may be used in place of the Cu layer. The Cu alloy in this case may include Cu as the main component such that the Cu content is 90 at. % or higher, and include other elements such as aluminum (Al), silver (Ag) and gold (Au). Further, it is also possible to use a layer made of a material selected from Ag, Ag alloy, Au, Au alloy, Al and Al alloy, in place of the Cu layer 28. Such interconnection materials may also be used as a conductor material forming a second interconnection and vias which will be described later.

Figure 5:
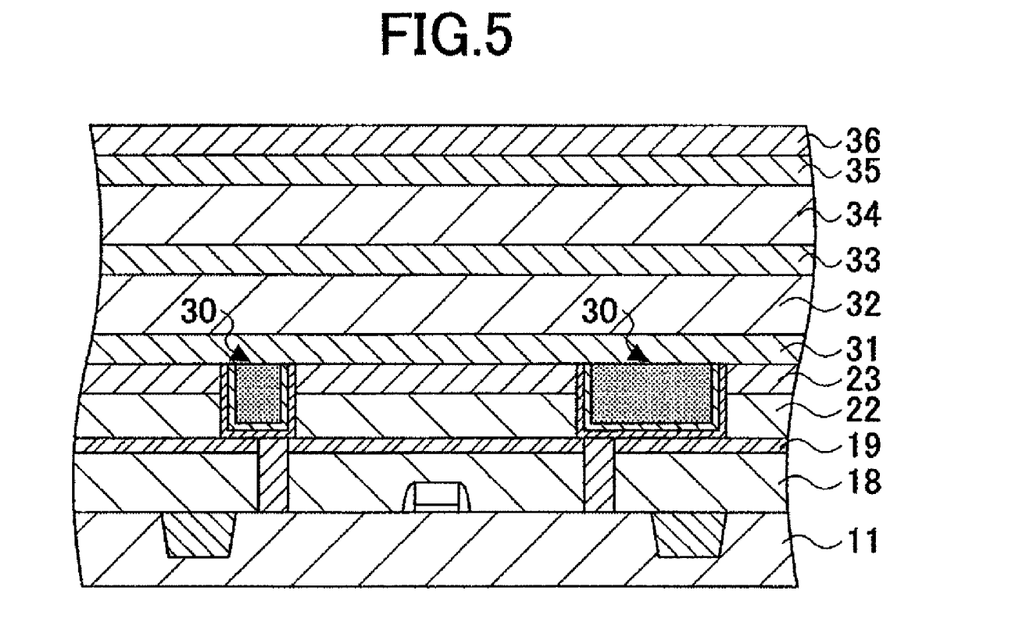
FIG. 5 is a cross sectional view for explaining a process of the embodiment of the method of producing semiconductor device according to the present invention.

Next, in the process shown in FIG. 5, a Cu-diffusion preventing layer 31 made of SiC is formed on the cap layer 23 to a thickness of approximately 50 nm, for example, by a plasma CVD in a manner similar to that employed when forming the SiC passivation layer 19. A surface treatment may be carried out by dropping a solution having 5% ammonium fluoride on the surface of the SiC Cu-diffusion preventing layer 31 and maintaining contact of the solution and the SiC Cu-diffusion preventing layer 31 for approximately 2 minutes at room temperature. Thereafter, a cleaning is carried out using pure water so as to remove the treatment solution, and a spin drying is carried out. As a result, the surface of the hydrophobic SiC Cu-diffusion preventing layer 31 becomes hydrophilic.

In addition, in the process shown in FIG. 5, a via layer 32 made of a low-k material is formed on the SiC Cu-diffusion preventing layer 31 by coating to a thickness of approximately 400 nm, for example, using SiLK (registered trademark)-J350 (product name, manufactured by The Dow Chemical Company) which is a liquid material. The via layer 32 is baked after the coating, and is then cured by a thermal process.

The via layer 32 is preferably made of the low-k material from the point of view of reducing the RC delay. However, the via layer 32 is not limited to the low-k material layer, and other known interlayer insulator layers may be used, such as a SiO layer, a tetraethyl orthosilicate (TEOS) layer, a silicon oxide nitride (SiON) layer and a PSG layer.

Moreover, in the process shown in FIG. 5, an etching stopper layer 33 made of SiC is formed on the via layer 32 to a thickness of approximately 50 nm, for example. The etching stopper layer 33 is formed by a plasma CVD in a manner similar to that employed when forming the SiC passivation layer 19. A surface treatment may be carried out by dropping a solution having 5% ammonium fluoride on the surface of the SiC etching stopper layer 33, in a manner similar to that carried out for the SiC passivation layer 19.

Furthermore, in the process shown in FIG. 5, an interconnection (or wiring) layer 34 made of a low-k material is formed on the SiC etching stopper layer 33 to a thickness of approximately 400 nm, for example. For example, the interconnection layer 34 is formed by coating Porous SiLK (registered trademark) Y (product name, manufactured by The Dow Chemical Company), which is a liquid material. The interconnection layer 34 is baked after the coating, and is then cured by a thermal process. The RC delay can be reduced considerably by forming the interconnection layer 34 from the low-k material.

Known materials other than those described above may be used for the via layer 32 and the interconnection layer 34. The low-k material used for the via layer 32 and the interconnection layer 34 has a permittivity that is lower than the permittivity (3.9 to 4.2) of SiO in the above described case, but examples of other usable materials include $SiO_2$—$B_2O_3$ (BSG) having a permittivity of 3.5 to 3.7, SiOC having a permittivity of 2.5 to 2.8, porous silica having a permittivity of 2.4 such as nano clustering silica (NCS) (product name, manufactured by Catalysts & Chemicals Ind. CO., LTD.), and organic siloxane such as porous Black Diamond (product name, manufactured by Applied Materials, Inc.), CORAL (registered trademark, manufactured by Novellus Systems, Inc.) having a permittivity of 3.2, and HOSP (registered trademark, manufactured by Honeywell Electronic Materials) having a permittivity of 2.5.

Furthermore, in the process shown in FIG. 5, a cap layer 35 made of SiC is formed by CVD to a thickness of approximately 100 nm, for example, on the interconnection layer 34. A hard mask layer 36 made of SiN is formed by CVD to a thickness of approximately 50 nm, for example, on the SiC cap layer 35.

Next, in the process shown in FIG. 6, a resist layer (not shown) is formed on the surface of the SiN hard mask layer 36, and openings are formed by a photolithography technique at positions where the interconnection grooves are to be formed in a later process. In addition, a dry etching is carried out using this resist layer is used as a mask, so as to etch the SiN hard mask layer 36 and form openings 36-1. The resist layer is then removed.

Moreover, in the process shown in FIG. 6, a resist layer 38 is formed to cover the surfaces of the SiN hard mask layer 36 and the SiC cap layer 35, and openings 38-1 are formed in the resist layer 38 at positions where via holes are to be formed in a later process. Further, a dry etching is carried out using this resist layer 38 as a mask to form via holes 39 which penetrate the SiC cap layer 35, the interconnection layer 34, the SiC etching stopper layer 33 and the via layer 32 and expose the surface of the SiC Cu-diffusion preventing layer 31.

Figure 6:
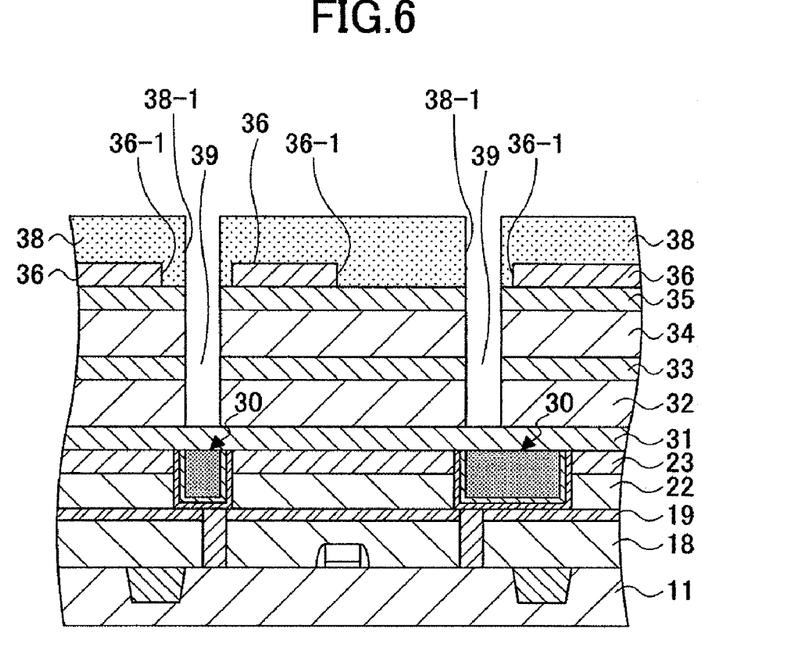
FIG. 6 is a cross sectional view for explaining a process of the embodiment of the method of producing semiconductor device according to the present invention.
Figure 7:
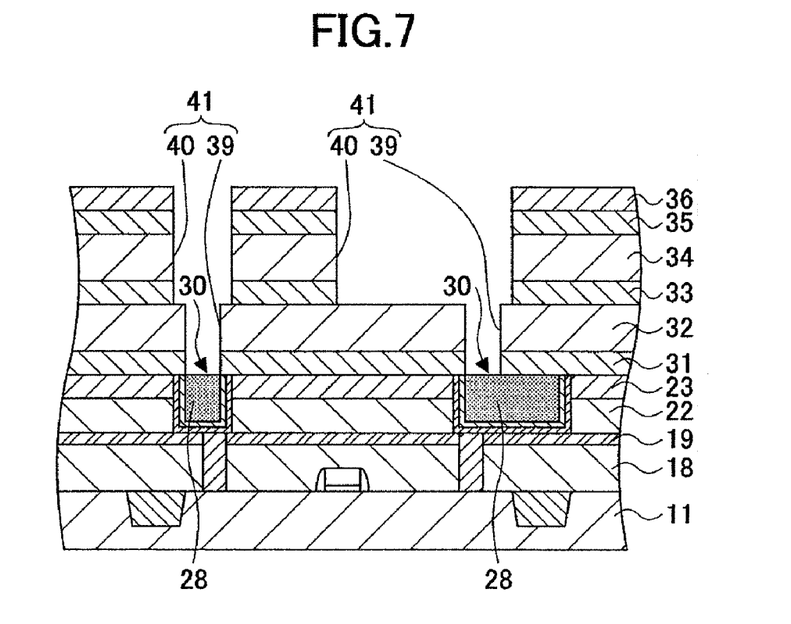
FIG. 7 is a cross sectional view for explaining a process of the embodiment of the method of producing semiconductor device according to the present invention.

Next, in the process shown in FIG. 7, the resist layer 38 shown in FIG. 6 is removed, and a dry etching is carried out using the SiN hard mask layer 36 as a mask to etch the SiC cap layer 35 and the interconnection layer 34.

In addition, in the process shown in FIG. 7, the SiC etching stopper layer 33 and the SiC Cu-diffusion preventing layer 31 at the bottom of the via holes 39 are etched using the SiN hard mask layer 36 as a mask, so as to expose the surface of the first interconnection 30. As a result, the surfaces defining the interconnection grooves 40 and the surface of the first interconnection 30 are exposed in the via holes 39 that are formed, and openings 41 (interconnection grooves 30 and via holes 39) for the dual damascene interconnection are completed.

Moreover, in the process shown in FIG. 7, the surface of the structure shown in FIG. 7 is cleaned. The cleaning process is carried out to remove the foreign particles such as the resist residue and the residue (or reaction product) generated by the etching, and in particular, to remove the foreign particles adhered on the surfaces defining the openings 41 and the surface of the first interconnection 30. The foreign particles, if not removed, would otherwise cause an increase of the interconnect resistance or a disconnection of the dual damascene interconnection. However, the foreign particles can be removed in an extremely effective manner by the cleaning process which will be described hereunder, and damages to the via layer and the interconnection layer 34 that are made of the low-k material can be avoided.

Figure 9:
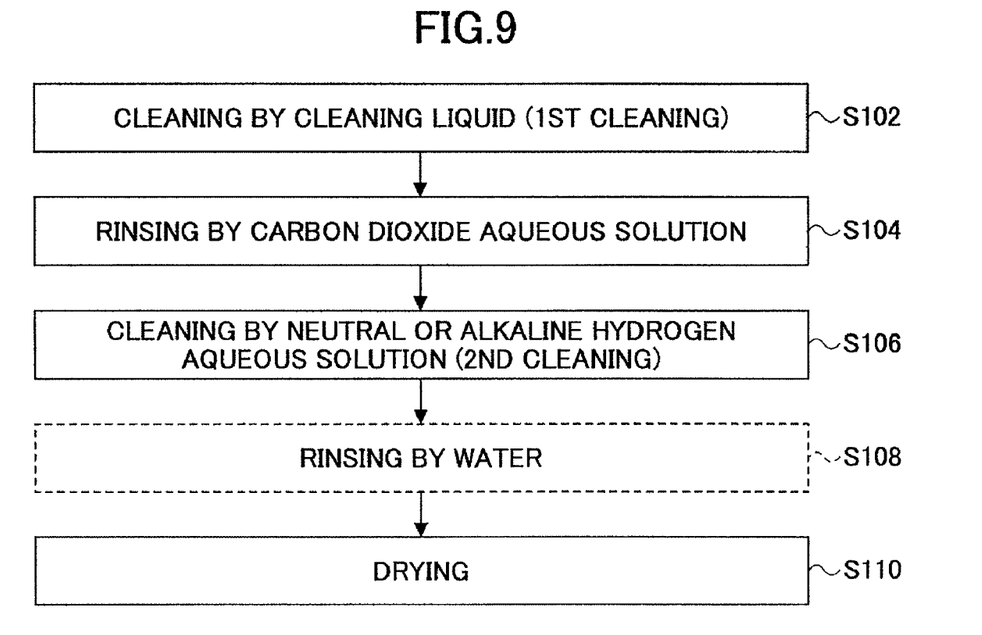
FIG. 9 is a flow chart for explaining a cleaning process of the embodiment of the method of producing semiconductor device.

FIG. 9 is a flow chart for explaining the cleaning process of this embodiment of the method of producing semiconductor device. The cleaning process shown in FIG. 9 includes a first cleaning process of step S102 which uses a cleaning liquid, a rinsing process of step S104 which uses a carbon dioxide aqueous solution, a second cleaning process of step S106 which uses a neutral or alkaline hydrogen aqueous solution, a rinsing process of step S108 which uses water and is carried out if necessary, and a drying process of step S110, in this order. Each process of the cleaning process will be described hereunder by referring to FIGS. 7 and 9.

First, the first cleaning process of the step S102 is carried out using the cleaning liquid. This first cleaning process is carried out with respect to the structure (hereinafter also referred to as a wafer structure) shown in FIG. 7, by supplying the cleaning liquid on the surface of the wafer structure (hereinafter referred to as the wafer structure surface) while rotating the structure at 100 rpm to 1000 rpm, for example, using a single wafer spin cleaner. For example, the cleaning liquid may be selected from organic amine cleaning agent, fluorine compound (for example, ammonium fluoride) cleaning agent, ammonium phosphate cleaning agent, organic acid cleaning agent, hydrofluoric acid cleaning agent, oxalic acid cleaning agent and ammonium cleaning agent. The amount of cleaning liquid supplied may be appropriately selected depending on the wafer size, and is preferably set in a range of 0.05 liter/minute to 2 liters/minute. Relatively large foreign particles, such as the resist residue and the residue (reaction product) generated by the etching, that are adhered on the surfaces defining the openings 41 and the surface of the first interconnection 30, can be removed by the first cleaning process.

Next, the rinsing process of the step S104 is carried out to clean the surface of the wafer structure using the carbon dioxide aqueous solution. In particular, the rinsing process is carried out by supplying the carbon dioxide aqueous solution to the wafer structure surface while rotating the wafer structure. Hence, the residual cleaning liquid on the wafer structure surface is removed by the rinsing process. The carbon dioxide aqueous solution is obtained by blowing carbon dioxide into pure water to dissolve the carbon dioxide therein, and includes carbonic acid ($H_2CO_3$). The carbon dioxide aqueous solution is acescent, and has a pH of 6 or higher and less than 7.

If pure water is used for the rinsing liquid, electrostatic is generated due to friction between the pure water and the wafer structure or, a charge accumulated in the wafer structure shown in FIG. 7 by the plasma when the dry etching is carried out, and the wafer structure may be damaged by electrostatic. However, by using the carbon dioxide aqueous solution for the rinsing liquid, it is possible to suppress the generation of electrostatic or, prevent discharge of the charge accumulated in the wafer structure. From the point of view of further suppressing the undesirable effects of the electrostatic generation and the accumulated charge, the resistivity of the carbon dioxide aqueous solution is preferably set in a range of 0.01 MΩ·cm to 1 MΩ·cm. If the resistivity of the carbon dioxide aqueous solution is less than 0.01 MΩ·cm, it is impractical from the point of view of the solubility of carbon dioxide with respect to water. On the other hand, if the resistivity of the carbon dioxide aqueous solution exceeds 1 MΩ·cm, the effect of suppressing the generation of electrostatic has a tendency of gradually decreasing.

If the organic amine cleaning agent is used in the first cleaning process of the step S102, the coating of the copper oxide on the surface of the Cu layer forming the first interconnection 30 is removed. Moreover, if pure water is simply used for the rinsing liquid in the rinsing process of the step S104, elution of the Cu layer forming the first interconnection 30 may occur due to the effects of the oxygen existing within the pure water or the accumulated charge. On the other hand, by using the carbon dioxide aqueous solution for the ringing liquid, a thin film of copper oxide or copper carbonate is formed on the surface of the Cu layer forming the first interconnection 30 exposed at the openings 41 to thereby result in passivation. Hence, it is possible to prevent elution of the Cu layer forming the surface of the first interconnection 30. The use of the carbon dioxide aqueous solution is preferable from the point of view of preventing the further elution of the Cu layer, because a thin film of copper carbonate formed on the surface of the Cu layer forming the first interconnection 30. In addition, the use of carbon dioxide aqueous solution is preferable from the point of view of having effects similar to those obtained for the Cu layer even when the first interconnection 30 is formed by a layer other than the Cu layer, such as the above described Cu alloy layer having Cu as the main component.

Even if the carbon dioxide aqueous solution remains on the surface of the wafer structure shown in FIG. 7, the carbonic acid will not isolate from other solids. Accordingly, the use of the carbon dioxide aqueous solution is also preferable from the point of view of enabling easy removal in the second cleaning process of the next step S106 when compared to cases where other acescent solutions which will be described later are used.

Next, the second cleaning process of the step S106 is carried out by supplying the neutral or alkaline hydrogen aqueous solution to the surface of the wafer structure. The neutral or alkaline hydrogen aqueous solution is supplied to the surface of the wafer structure shown in FIG. 7 by use of the single wafer spin cleaner. The foreign particles which could not be removed by the first cleaning process carried out prior to the second cleaning process, particularly the residue generated by the etching and the micro particles deposited on the inner walls of an etching chamber of the etching apparatus and adhered on the surface of the wafer structure, can be removed by the second cleaning process. In addition, the second cleaning process can suppress readherence of the foreign particles on the surface of the wafer structure. The details of the functions of the hydrogen aqueous solution are not completely known, but it may be regarded that, when supplied to the surface of the wafer structure, the hydrogen aqueous solution causes the zeta potential of the foreign particles that are adhered on the surface of the wafer structure to change. The effects of supplying the hydrogen aqueous solution will be described later in more detail in conjunction with embodiment samples.

The hydrogen aqueous solution may be obtained by not adding electrolyte to pure water and causing the hydrogen generated by the reaction $4H^+ + 4e^- \rightarrow 2H_2$ at the cathode due to electrolytic process to dissolve into the pure water. The hydrogen aqueous solution may also be obtained by blowing and dissolving hydrogen into pure water. For example, the dissolved hydrogen within the hydrogen aqueous solution is set in a range of 0.5 ppm to 1.5 ppm.

The hydrogen aqueous solution may be alkaline, and may be added with a pH regulator or modifier. Examples of the pH regulator include tetramethyl ammonium hydroxide (TMAH), potassium hydroxide and ammonia. By making the hydrogen aqueous solution neutral or alkaline, it is possible to expose the Cu metal by reducing the copper oxide or removing the copper carbonate on the surface of the Cu layer forming the first interconnection 30 exposed within the openings 41. As a result, it is possible to greatly reduce the contact resistance between the first interconnection 30 and the Cu material that is filled into the via holes in the next process.

The amount of hydrogen aqueous solution supplied to the surface of the wafer structure is appropriately set depending on the wafer size, and is preferably set in a range of 0.1 liter/minute to 3 liters/minute.

The hydrogen aqueous solution may simply be poured onto the surface of the wafer structure using an ejection nozzle or the like. However, it is preferable to provide an ultrasonic transducer on the ejection nozzle, so as to pour the hydrogen aqueous solution onto the surface of the wafer structure while applying ultrasonic waves to the hydrogen aqueous solution. By the impact of the ultrasonic waves, it becomes easier to remove the foreign particles using the hydrogen aqueous solution. From the point of view of easy removal of the foreign particles, the frequency of the ultrasonic waves is preferably set in a range of 0.5 MHz to 10 MHz and the output of the ultrasonic waves is preferably set in a range of 0.3 W to 10 W.

The conventional two-fluid cleaning, due to its strong impact force, can satisfactorily remove the foreign particles. But in the case of a low-k layer, and particularly in the case of a porous low-k layer, the conventional two-fluid cleaning will easily cause mechanical damage to the low-k layer because of its reduced mechanical strength.

Figure 10:
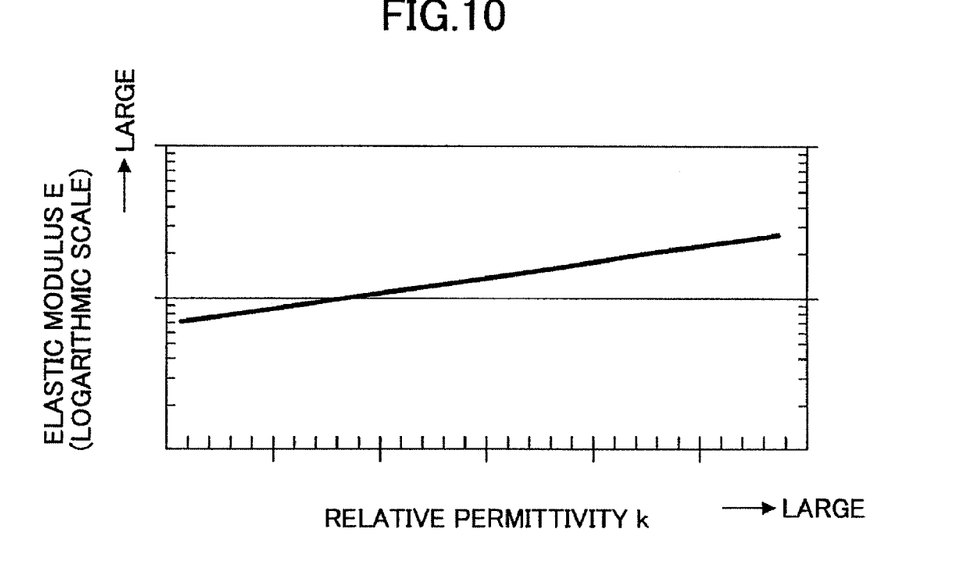
FIG. 10 is a diagram showing a relationship between an elastic modulus and a permittivity of a low-k layer.

FIG. 10 is a diagram showing a relationship between an elastic modulus and a permittivity of a low-k layer. In FIG. 10, the ordinate indicates the elastic modulus E in logarithmic scale, and the elastic modulus E becomes larger in an upward direction. On the other hand, the abscissa indicates the permittivity k, and the permittivity becomes larger in a rightward direction in FIG. 10.

As may be seen from FIG. 10, as the permittivity k of the low-k layer decreases, the elastic modulus E decreases exponentially. In other words, if the permittivity k of the material used for the low-k layer is low in order to reduce the RC delay, the elastic modulus E of the low-k layer also becomes low, which in turn requires the second cleaning process to employ a cleaning method having a low impact force. Because the impact force of the hydrogen aqueous solution applied with the ultrasonic waves is lower than that of the conventional two-fluid cleaning, it is possible to suppress damages to the via layer 32 and the interconnection layer 34 that are made of the low-k material by use of the hydrogen aqueous solution applied with the ultrasonic waves.

Returning now to the description of FIG. 9, the rinsing process of the step S108 is carried out by supplying pure water to the surface of the wafer structure if necessary. In addition, it is possible to use, in place of the pure water, a rinsing liquid which has a pH of 6.5 to 7.5 and is made of pure water added with an acescent or alkalescent pH regulator.

Next, the drying process of the step S110 is carried out. For example, the drying process is carried out by rotating the wafer structure at a high speed of 2000 rpm to 5000 rpm by a spin drier and draining water on the surface of the wafer structure by centrifugal force. The cleaning process is completed by the above described steps S102 through S110.

The cleaning process described above includes the rinsing process of the step S104 using the carbon dioxide aqueous solution. However, it is possible to use, in place of the carbon dioxide aqueous solution, acidic water (or acidic aqueous solution) made of pure water added with an acidic organic acid.

Figure 11:
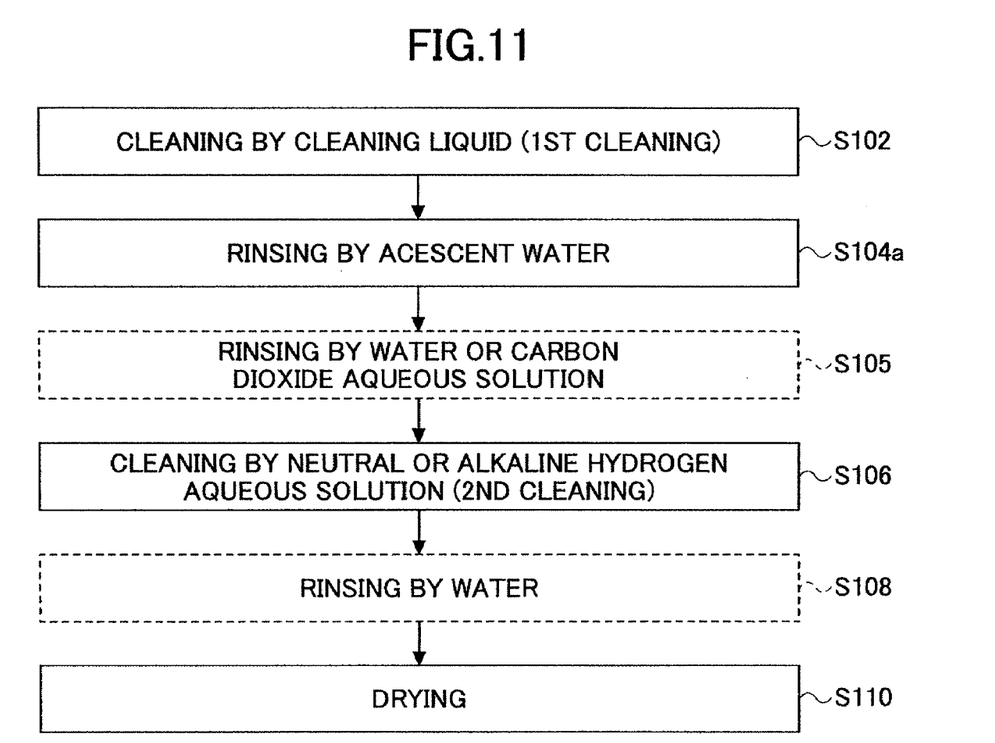
FIG. 11 is a flow chart for explaining a modification of the cleaning process shown in FIG. 9.

FIG. 11 is a flow chart for explaining a modification of the cleaning process shown in FIG. 9. In FIG. 11, those steps that are the same as those corresponding steps in FIG. 9 are designated by the same reference numerals, and a description thereof will be omitted.

The cleaning process shown in FIG. 11 includes a first cleaning process of step S102 which uses a cleaning liquid, a rinsing process of step S104a which uses acescent water, a rinsing process of step S105 which uses water or carbon dioxide aqueous solution and is carried out if necessary, a second cleaning process of step S106 which uses a neutral or alkaline hydrogen aqueous solution, a rinsing process of step S108 which uses water and is carried out if necessary, and a drying process of step S110, in this order.

In this modification of the cleaning process, the rinsing process of the step S104a which uses the acescent water is carried out after the first cleaning process of the step S102 which uses the cleaning liquid. The acescent water is obtained by adding acescent organic acid to pure water. Examples of the organic acid include citric acid, malic acid, tartaric acid, lactic acid, glycolic acid, oxalic acid, malonic acid, succinic acid and phthalic acid. By using the acescent rinsing liquid, it is possible to obtain effects similar to those obtained by use of the carbon dioxide aqueous solution described above, that is, the effects of suppressing the undesirable effects of the electrostatic generation and the accumulated charge and resulting in passivation of the surface of the Cu layer forming the first interconnection 30.

Next, the rinsing process of the step S105 which uses the water or carbon dioxide aqueous solution to rinse the surface of the wafer surface is carried out if necessary. By carrying out this rinsing process, it is possible to avoid residue of the organic acid from remaining on the surface of the wafer structure. This rinsing process may be omitted if substitutable by the next second cleaning process of the step S106 which uses the acescent or alkaline hydrogen aqueous solution. The processes carried out after the step S105 are the same as those carried out in the cleaning process shown in FIG. 9.

Figure 8:
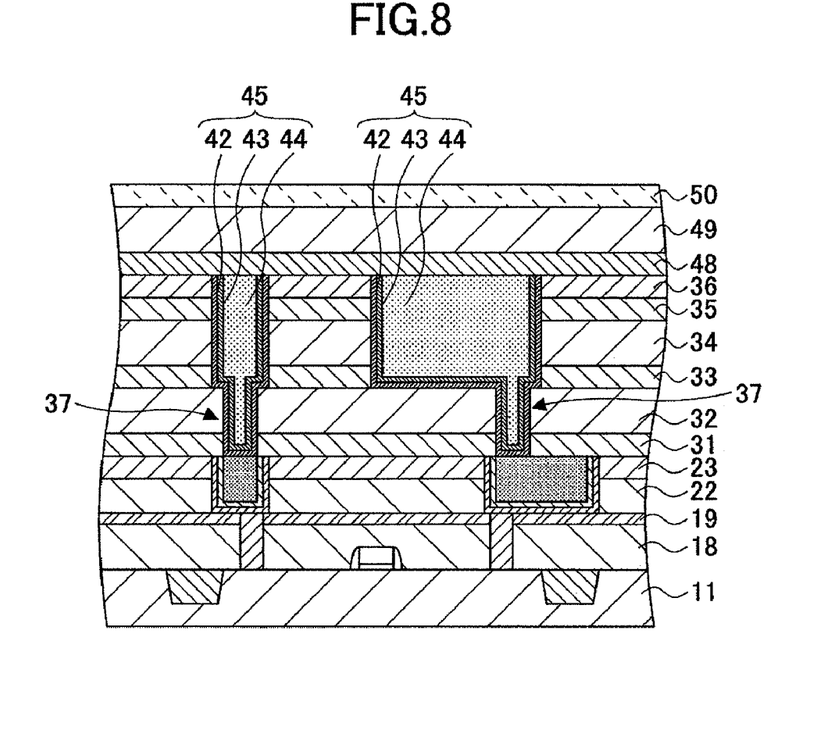
FIG. 8 is a cross sectional view for explaining a process of the embodiment of the method of producing semiconductor device according to the present invention.

In the process shown in FIG. 8 which is after the cleaning process described above, a barrier metal layer 42, a seed metal layer 43 and a Cu layer 44 are successively stacked on the surfaces defining the via holes 39 and the interconnection grooves 40 shown in FIG. 7, in a manner similar to that described above with respect to the process shown in FIG. 4. In addition, using the hard mask layer 36 as a polishing stopper layer, the barrier metal layer 42, the seed metal layer 43 and the Cu layer 44 on the hard mask layer 36 are removed by CMP. As a result, a second interconnection 45 is completed, and a dual damascene interconnection made up of vias 37 and the second interconnection 45 is formed. The hard mask layer 36 may be removed when carrying out the CMP.

Moreover, in the process shown in FIG. 8, a plasma CVD is carried out to form a SiC layer, as a Cu-diffusion preventing layer 48, to a thickness of approximately 50 nm, for example, on the second interconnection 45 and the hard mask layer 36. Furthermore, a CVD is carried out to form a silicon oxide (SiO) layer 49 and a passivation layer 50 which is made up of a silicon nitride (SiN) layer, on the Cu-diffusion preventing layer 48. Although omitted in FIG. 8, pad electrodes which are electrically connected to the second interconnection 45 may be formed on the passivation layer 50.

When forming additional interconnections in the multilayer interconnection structure, the additional interconnections may be formed by repeating the above described process from the formation of the via layer 32 and the like shown in FIG. 5 to the process shown in FIG. 8 using the CMP.

According to this embodiment, the rinsing process of the step S104 shown in FIG. 9 supplies the carbon dioxide aqueous solution, as the rinsing liquid, to the surface of the wafer structure. Hence, it is possible to form a thin film of copper oxide or copper carbonate on the surface of the Cu layer forming the first interconnection 30 to thereby result in passivation and prevent elution of the Cu layer forming the surface of the first interconnection 30. In addition, the second cleaning process of the step S106 shown in FIG. 9 supplies the neutral or alkaline hydrogen aqueous solution to the surface of the wafer structure. Thus, it is possible to remove the foreign particles, reduce the thin film of the copper oxide formed on the surface of the first interconnection 30 or, remove the thin film of the copper carbonate formed on the surface of the first interconnection 30, so that the Cu metal surface of the first interconnection 30 is formed. Accordingly, it is possible to remove the foreign particles while at the same time suppressing the elution of the first interconnection 30 and also avoiding damages to the via layer 32 and the interconnection layer 34 which are made of the low-k material. As a result, the permittivity and the interconnect resistance of the via layer 32 and the interconnection layer 34 are reduced by avoiding the damages to the via layer 32 and the interconnection layer 34, and the CR delay is consequently reduced to thereby realize a semiconductor device capable of performing a high-speed operation and having a high reliability. In addition, because the surface of the first interconnection 30 becomes a metal surface, it is possible to reduce the contact resistance between the first interconnection 30 and the vias 37 to thereby enable the CR delay to be further reduced.

Moreover, in the rinsing process of the step S104a shown in FIG. 11, it is possible to obtain effects similar to those obtained by the step S104 shown in FIG. 9 which uses the carbon dioxide aqueous solution, by using the organic acid aqueous solution as the rinsing liquid.

In this embodiment, the etching stopper layer 33 is provided between the via layer 32 and the interconnection layer 34 as shown in FIG. 8. However, this etching stopper layer 33 may be omitted. In addition, in the process shown in FIG. 4, it is possible to carry out the cleaning process shown in FIG. 9 or FIG. 11 after removing the resist layer 24. In this case, it is possible to clean the surface of the interconnection grooves 22-1 without damaging the interconnection grooves 22-1 which are formed in the interlayer insulator layer 22 which is made of the low-k material.

EMBODIMENT SAMPLES

Next, a description will be given of embodiment samples of the semiconductor device produced by this embodiment of the method of producing semiconductor device. The semiconductor device described above in conjunction with FIGS. 1 through 8 was produced by forming 100 via chains on the wafer surface, where each via chain includes 3,000,000 vias which are electrically connected in series by the interconnection. Various low-k materials were used for the via layer 32 and the interconnection layer 34 shown in FIG. 8, and the wafer structure shown in FIG. 7 was cleaned under various cleaning conditions.

First, a description will be given of the processes of the method of producing the semiconductor device that are common to the embodiments and comparison samples. A wafer having a diameter of 200 mm was used to carry out the processes described above in conjunction with FIGS. 1 through 3. Then, in the process shown in FIG. 4, the interlayer insulator layer 22 was formed to a thickness of 150 nm using Porous SiLK (registered trademark) Y (product name, manufactured by The Dow Chemical Company) using a spin coater and the first interconnection 30 was formed. Further, the cap layer 23 was formed by CVD to a thickness of 100 nm using silicon oxide (SiO).

Next, the interconnection grooves for the first interconnection 30 were formed in the cap layer 23 and the interlayer insulator layer 22, with a width of 100 nm and a depth of 250 nm, by the process described above with reference to FIG. 4. Then, the first interconnection 30 was formed to a thickness that fills the interconnection grooves 22-1, by forming the TaN barrier metal layer 25 to a thickness of 30 nm by sputtering, forming the Cu seed metal layer 26 to a thickness of 30 nm by sputtering, and forming the Cu layer 28 by electroplating. Thereafter, the surface of the wafer structure was planarized by CMP until the cap layer 23 is exposed, so that the Cu layer 28 has a thickness of approximately 190 nm.

Then, in the process shown in FIG. 5, the SiC Cu-diffusion preventing layer 31 having a thickness of 50 nm, the via layer 32 made of a material described later and having a thickness of 500 nm, the SiC etching stopper layer 33 having a thickness of 50 nm, the interconnection layer made of a material described later and having a thickness of 400 nm, the SiC cap layer 35 having a thickness of 100 nm, and the SiN hard mask layer 36 having a thickness of 50 nm were successively stacked in this order on the cap layer 23 and the first interconnection 23 by plasma CVD.

Next, in the processes shown in FIGS. 6 and 7, the via holes 39 having an inner diameter of 130 nm and a depth of 150 nm and the interconnection grooves 40 having a width of 130 nm and a depth of 150 nm, which expose the surface of the Cu layer forming the first interconnection 30, were formed. The inner diameter and the width are dimensions taken on a cross section parallel to the wafer surface.

Thereafter, the cleaning process shown in FIG. 9 was carried out to clean the openings 41 formed by the via holes 39 and the interconnection grooves 40. In particular, the steps S102, S104, S106 and S110 were carried out in this order. First, a spin cleaner was used to supply a cleaning liquid described later at 1 liter/minute onto the surface of the wafer structure while rotating the wafer structure at 1000 rpm to carry out the first cleaning process of the step S102 for 2 minutes. Then, carbon dioxide aqueous solution having a set pH and resistivity were supplied at 2 liters/min onto the surface of the wafer structure while rotating the wafer structure at 1000 rpm to carry out the ringing process of the step S104.

Thereafter, hydrogen aqueous solution having a set pH was supplied from an ejection nozzle provided with an ultrasonic transducer which applies ultrasonic waves having a frequency of 2 MHz and a power of 40 W, in order to supply the hydrogen aqueous solution at 0.5 liter/minute onto the surface of the wafer structure while rotating the wafer structure at 1000 rpm to carry out the second cleaning process of the step S106. When producing comparison samples Cmp4 through Cmp10 which will described later, the conventional two-fluid cleaning was carried out in place of the second cleaning process using the hydrogen aqueous solution, by supplying a mist of pure water supplied at 0.1 liter/minute and nitrogen supplied at 100 liters/minute onto the surface of the wafer structure. Thereafter, a spin dryer was used to rotate the wafer structure at 3000 rpm for 30 seconds to carry out the drying process of the step S110. By the above described processes, the cleaning of the surface of the wafer structure including the openings 41 was completed.

Next, in the process shown in FIG. 8, the second interconnection 45 was formed to a thickness that fills the interconnection grooves 40, by forming the TaN barrier metal layer 42 to a thickness of 30 nm by sputtering, forming the Cu seed metal layer 43 to a thickness of 30 nm by sputtering, and forming the Cu layer 44 by electroplating. Then, the second interconnection 45 was planarized by CMP until the vias 37 and the cap layer 36 are exposed, to complete the second interconnection 45. In addition, the SiC Cu-diffusion preventing layer 48 was formed to a thickness of 50 nm, the silicon oxide (SiO) layer 49 was formed to a thickness of 600 nm, and the silicon nitride (SiN) passivation layer 50 was formed to a thickness of 50 nm, each by plasma CVD, on the second interconnection 45 and the hard mask layer 36. Moreover, conductor terminals for testing were formed on both ends of the via chain in which 3,000,000 vias are electrically connected in series by the first interconnection 30 and the second interconnection 45.

The embodiment samples and the comparison samples were evaluated as follows. That is, in order to evaluate the cleanness of the wafer surface after the cleaning of the openings is completed, the number of foreign particles on the wafer surface was counted using a scanning electron microscope (SEM). The foreign particles were counted by enlarging the area of the wafer surface by the SEM, and counting foreign particles having a size of 0.2 μm or larger within a region of 1 cm$^2$ on the wafer surface.

In addition, the damage to the interconnection pattern such as the interconnection grooves and the via holes after the cleaning were evaluated using the SEM. That is, a region of 1 cm$^2$ on the wafer surface was observed using the SEM at 9 locations on the wafer surface, and the damage to the interconnection pattern was evaluated as existing (or YES) if a damage such as spreading (or breaking) and stripping (or separation) is observed in at least one location of one of the interconnection grooves and the via holes. In the region of 1 cm$^2$ on the wafer surface, the interconnection grooves had an overall length of 10 m and 40,000 via holes were formed.

The disconnection of the via chain was evaluated by a continuity test, the via chain was evaluated as being acceptable when the continuity was detected. The via chain yield (%) was obtained from {(the number of acceptable via chains)/(total number of via chains)×100}, where the total number of via chains is 100 in this case.

Next, a description will be given of the cleaning conditions and the evaluation results of the embodiment samples and the comparison samples, by referring to FIGS. 12 through 15. FIGS. 12 through 15 are diagrams showing the cleaning conditions and the evaluation results of the embodiment samples and the comparison samples.

Embodiment Samples Emb1-Emb5 & Comparison Samples Cmp1-Cmp4

Figure 12:
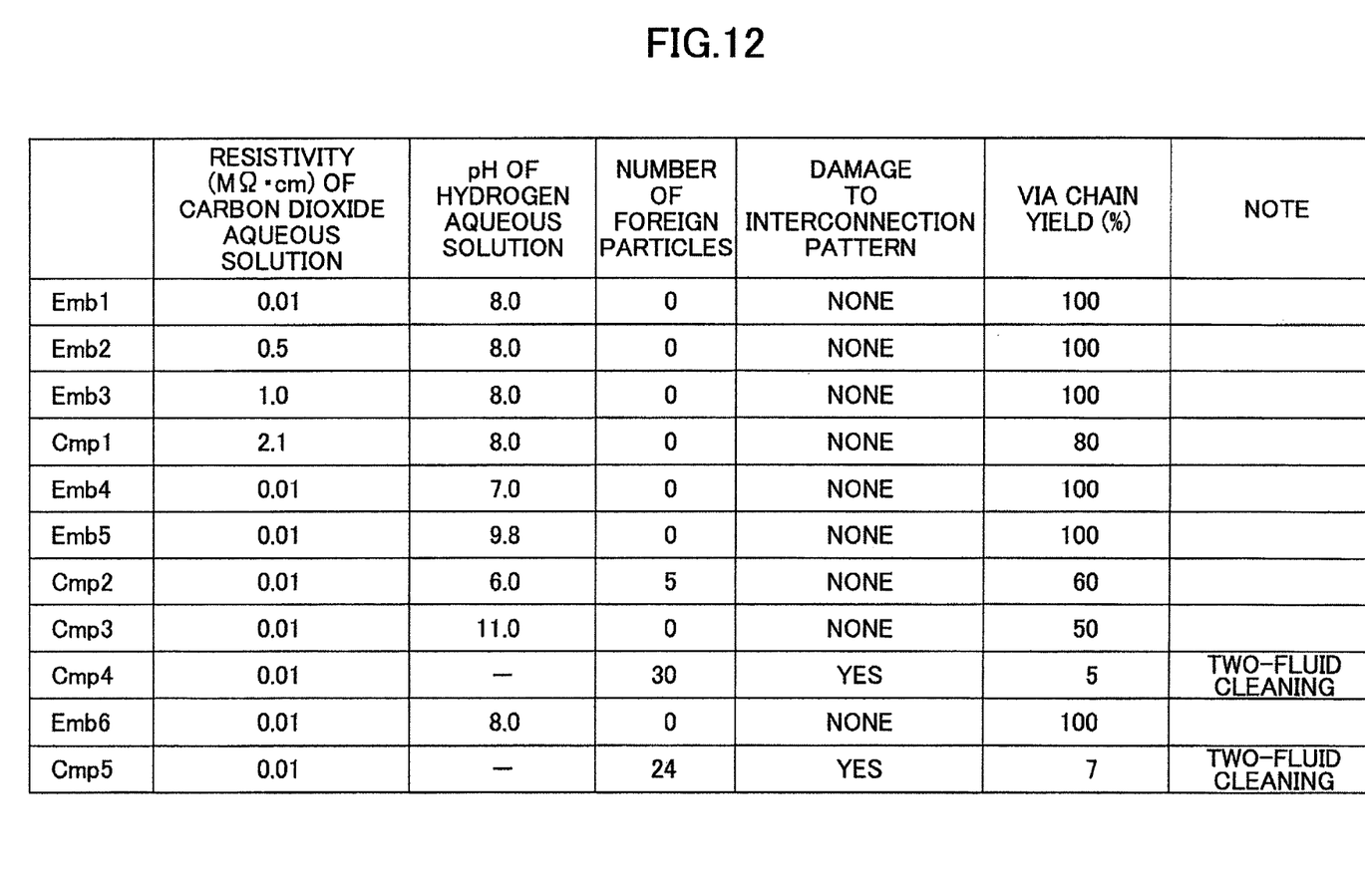
FIG. 12 is a diagram showing cleaning conditions and evaluation results of embodiment samples and comparison samples.

FIG. 12 shows the cleaning conditions and the evaluation results of the embodiment samples Emb1 through Emb5 and the comparison samples Cmp1 through Cmp4, and also the cleaning conditions and the evaluation results of the embodiment sample Emb6 and the comparison sample Cmp5 which will be described later.

In the case of the embodiment samples Emb1 through Emb5 and the comparison samples Cmp1 through Cmp4, the via layer 32 and the interconnection layer 34 shown in FIG. 6 were formed by a spin coater using the Porous SiLK (registered trademark) Y (product name, manufactured by The Dow Chemical Company). The EKC640 (registered trademark, manufactured by EKC Technology) based on fluorine compound was used for the cleaning liquid. In addition, the resistivity of the carbon dioxide aqueous solution and the pH of the hydrogen aqueous solution were set as shown in FIG. 12. The resistivity of the carbon dioxide aqueous solution was controlled by adjusting the carbon dioxide concentration. The pH of the hydrogen aqueous solution was set to a predetermined pH value by using TMAH as the pH regulator. The pH of the hydrogen aqueous solution was set similarly for both the embodiment samples and the comparison samples.

The number of foreign particles was zero (0) and no interconnection pattern damage was observed for the embodiment samples Emb1 through Emb5. The via chain yield was 80% for the comparison sample Cmp1, but the via chain yield was 100% for the embodiment samples Emb1 through Emb3. The resistivity of the carbon dioxide aqueous solution was set to 2.1 MΩ·cm for the comparison sample Cmp1, but the resistivity of the carbon dioxide aqueous solution was set in a range of 0.01 MΩ·cm to 1 MΩ·cm for the embodiment samples Emb1 through Emb3. Accordingly, it was found that the resistivity of the carbon dioxide aqueous solution is preferably set in the range of 0.01 MΩ·cm to 1 MΩ·cm.

The pH of the hydrogen aqueous solution was set in a range of 7 to 9.8 for the embodiment samples Emb1, Emb4 and Emb5. The pH of the hydrogen aqueous solution was set to 6 for the comparison sample Cmp2, and was set to 11 for the comparison sample Cmp3. Otherwise, the cleaning process was carried out under similar conditions for the embodiment samples Emb1 through Emb5 and the comparison samples Cmp1 through Cmp4. The number of foreign particles for each of the comparison sample Cmp2 was large compared to those of the embodiment samples Emb1, Emb4 and Emb5. The via chain yield for each of the comparison samples Cmp2 and Cmp3 was considerably poorer compared to those of the embodiment samples Emb1, Emb4 and Emb5. Therefore, it was found that the pH of the hydrogen aqueous solution is preferably set in a range of 7 to 9.8.

The conventional two-fluid cleaning was carried out for the comparison sample Cmp4 in place of the cleaning using the hydrogen aqueous solution. The number of foreign particles, the damage of the interconnection pattern and the via chain yield for the comparison sample Cmp4 were poor compared to those of the embodiment samples Emb1 through Emb5. Therefore, it was found that the cleaning process used for the embodiment samples Emb1 through Emb5 has a higher cleaning capacity (or performance) than the conventional two-fluid cleaning, and that a semiconductor device having a high reliability can be produced because the cleaning process does not damage the via layer and the interconnection layer which are made of the Porous SiLK (registered trademark) Y (product name, manufactured by The Dow Chemical Company).

Embodiment Sample Emb6 & Comparison Sample Cmp5

The via layer 32 shown in FIG. 6 was formed by plasma CVD using silicon oxide (SiO) for the embodiment sample Emb6 and the comparison sample Cmp5. Otherwise, the embodiment sample Emb6 and the comparison sample Cmp5 were formed similarly to the embodiment samples Emb1 through Emb5 under similar cleaning conditions. However, the conventional two-fluid cleaning was carried out for the comparison sample Cmp5 in place of the cleaning using the hydrogen aqueous solution.

Silicon oxide (SiO) having a mechanical strength, such as the elastic modulus, higher than that of the Porous SiLK (registered trademark) Y (product name, manufactured by The Dow Chemical Company) was used for the via layer 32 of the comparison sample Cmp5. However, damage of the interconnection pattern was observed for the comparison sample Cmp5. In addition, although the via chain yield of the comparison sample Cmp5 was slightly improved compared to that of the comparison sample Cmp4, the via chain yield of the comparison sample Cmp5 was considerably poorer than that of the embodiment sample Emb6. Therefore, it was also found from this comparison that the cleaning using the hydrogen aqueous solution is considerably improved compared to the conventional two-fluid cleaning.

Embodiment Samples Emb7-Emb11 & Comparison Sample Cmp6

Figure 13:
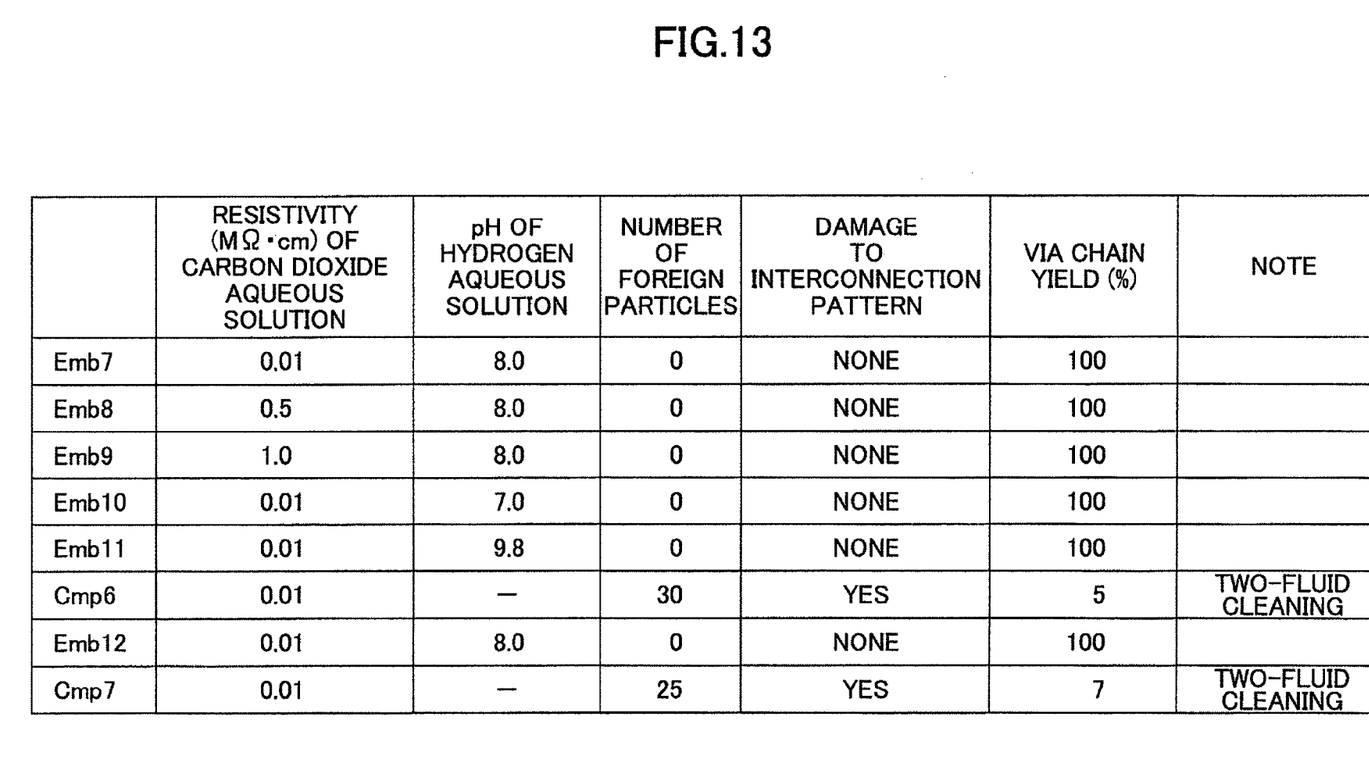
FIG. 13 is a diagram showing cleaning conditions and evaluation results of embodiment samples and comparison samples.

FIG. 13 shows the cleaning conditions and the evaluation results of the embodiment samples Emb7 through Emb11 and the comparison sample Cmp6, and also the cleaning conditions and the evaluation results of the embodiment sample Emb12 and the comparison sample Cmp7 which will be described later.

In the case of the embodiment samples Emb7 through Emb11 and the comparison sample Cmp6, the via layer 32 and the interconnection layer 34 shown in FIG. 6 were formed by CVD using the porous Black Diamond (product name, manufactured by Applied Materials, Inc.). An aqueous solution having 3 wt. % oxalic acid was used for the cleaning liquid. In addition, the resistivity of the carbon dioxide aqueous solution and the pH of the hydrogen aqueous solution were set as shown in FIG. 13.

The number of foreign particles was zero (0) and no interconnection pattern damage was observed for the embodiment samples Emb7 through Emb11. From the embodiment samples Emb7 through Emb9, it was found that the resistivity of the carbon dioxide aqueous solution is preferably set in the range of 0.01 M$\Omega$·cm to 1 M$\Omega$·cm. From the embodiment samples Emb7, Emb10 and Emb11, it was found that the pH of the hydrogen aqueous solution is preferably set in a range of 7 to 9.8.

The conventional two-fluid cleaning was carried out for the comparison sample Cmp6 in place of the cleaning using the hydrogen aqueous solution. The number of foreign particles, the damage of the interconnection pattern and the via chain yield for the comparison sample Cmp6 were poor compared to those of the embodiment samples Emb7 through Emb11. Therefore, it was found that the cleaning process used for the embodiment samples Emb7 through Emb11 has a higher cleaning capacity (or performance) than the conventional two-fluid cleaning, and that a semiconductor device having a high reliability can be produced because the cleaning process does not damage the via layer and the interconnection layer which are made of the porous Black Diamond (product name, manufactured by Applied Materials, Inc.).

Embodiment Sample Emb12 & Comparison Sample Cmp7

The via layer 32 shown in FIG. 6 was formed by plasma CVD using silicon oxide (SiO) for the embodiment sample Emb12 and the comparison sample Cmp7. Otherwise, the embodiment sample Emb12 and the comparison sample Cmp7 were formed similarly to the embodiment samples Emb7 through Emb11 under similar cleaning conditions. However, the conventional two-fluid cleaning was carried out for the comparison sample Cmp7 in place of the cleaning using the hydrogen aqueous solution.

Silicon oxide (SiO) having a mechanical strength, such as the elastic modulus, higher than that of the porous Black Diamond (product name, manufactured by Applied Materials, Inc.) was used for the via layer 32 of the comparison sample Cmp7. However, damage of the interconnection pattern was observed for the comparison sample Cmp7. In addition, although the via chain yield of the comparison sample Cmp7 was slightly improved compared to that of the comparison sample Cmp6, the via chain yield of the comparison sample Cmp7 was considerably poorer than that of the embodiment sample Emb12. Therefore, it was also found from this comparison that the cleaning using the hydrogen aqueous solution is considerably improved compared to the conventional two-fluid cleaning.

Embodiment Samples Emb13-Emb17 & Comparison Sample Cmp8

Figure 14:
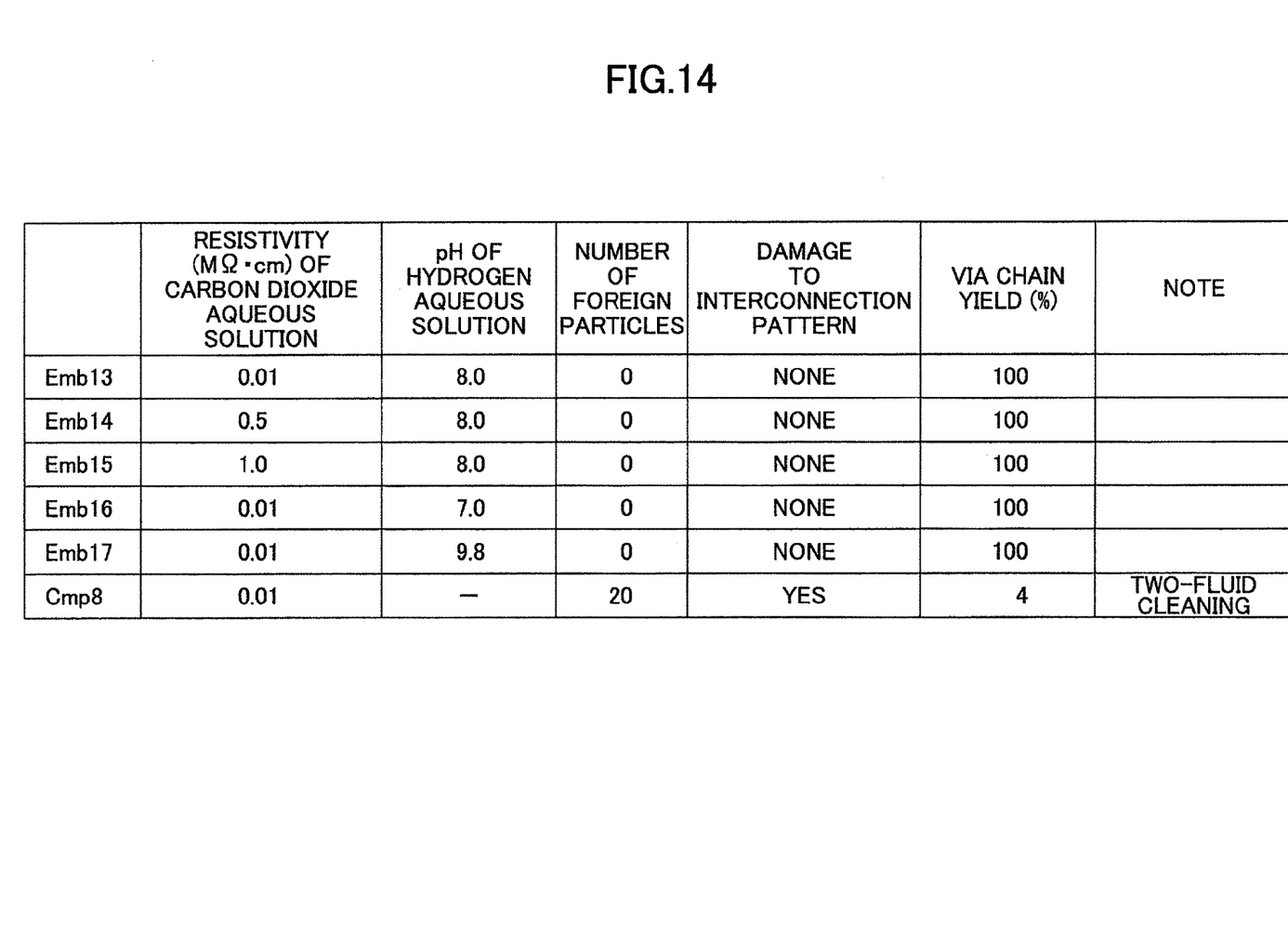
FIG. 14 is a diagram showing cleaning conditions and evaluation results of embodiment samples and comparison samples.

FIG. 14 shows the cleaning conditions and the evaluation results of the embodiment samples Emb13 through Emb17 and the comparison sample Cmp8.

In the case of the embodiment samples Emb13 through Emb17 and the comparison sample Cmp8, the via layer 32 and the interconnection layer 34 shown in FIG. 6 were formed by CVD using the CORAL (registered trademark, manufactured by Novellus Systems, Inc.). An aqueous solution having 3 wt. % oxalic acid was used for the cleaning liquid. In addition, the resistivity of the carbon dioxide aqueous solution and the pH of the hydrogen aqueous solution were set as shown in FIG. 14.

The number of foreign particles was zero (0) and no interconnection pattern damage was observed for the embodiment samples Emb13 through Emb17. From the embodiment samples Emb13 through Emb15, it was found that the resistivity of the carbon dioxide aqueous solution is preferably set in the range of 0.01 M$\Omega$·cm to 1 M$\Omega$·cm. From the embodiment samples Emb13, Emb16 and Emb17, it was found that the pH of the hydrogen aqueous solution is preferably set in a range of 7 to 9.8.

The conventional two-fluid cleaning was carried out for the comparison sample Cmp8 in place of the cleaning using the hydrogen aqueous solution. The number of foreign particles, the damage of the interconnection pattern and the via chain yield for the comparison sample Cmp8 were poor compared to those of the embodiment samples Emb13 through Emb17. Therefore, it was found that the cleaning process used for the embodiment samples Emb13 through Emb17 has a higher cleaning capacity (or performance) than the conventional two-fluid cleaning, and that a semiconductor device having a high reliability can be produced because the cleaning process does not damage the via layer and the interconnection layer which are made of the CORAL (registered trademark, manufactured by Novellus Systems, Inc.).

Embodiment Samples Emb18-Emb23 & Comparison Sample Cmp9

Figure 15:
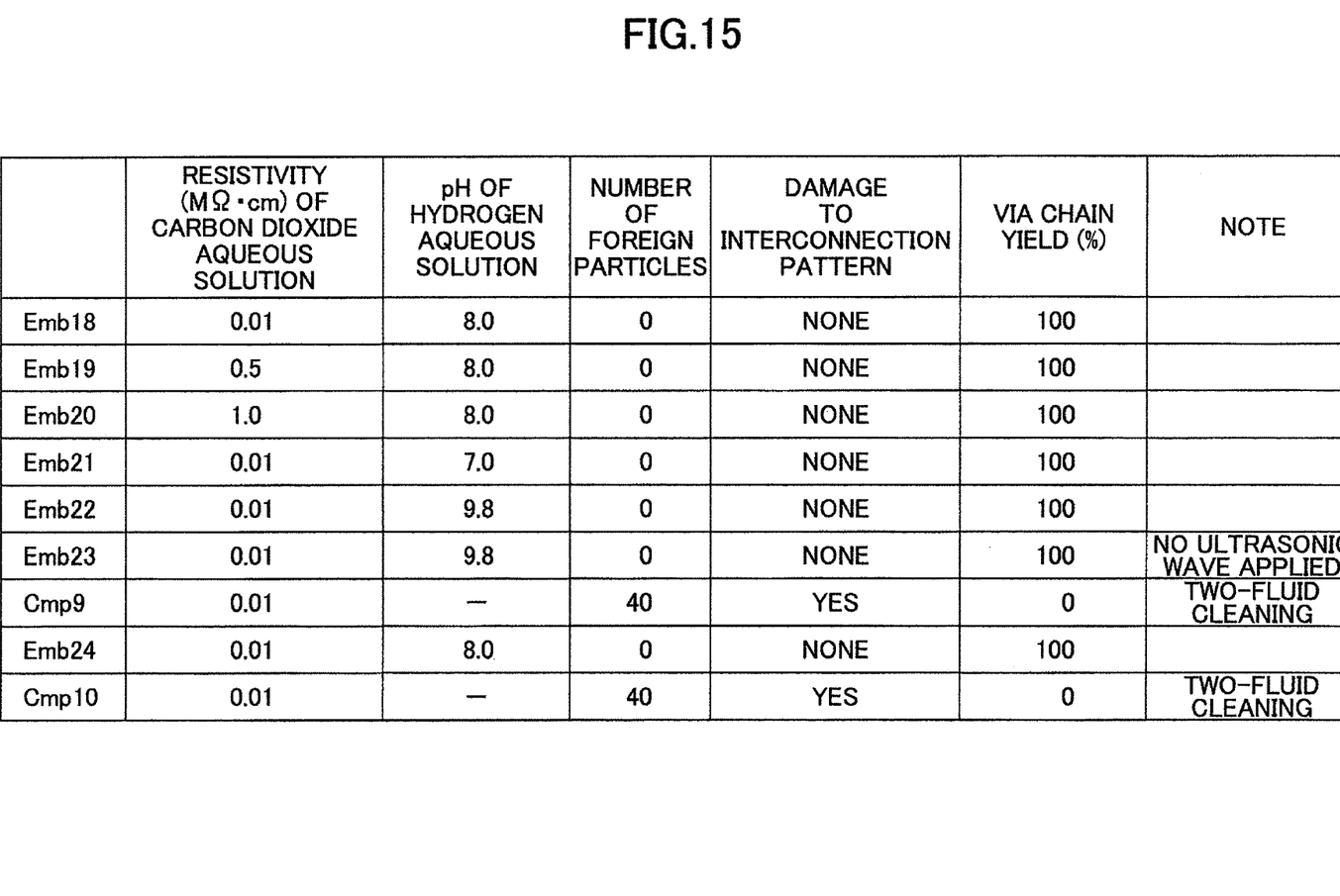
FIG. 15 is a diagram showing cleaning conditions and evaluation results of embodiment samples and comparison samples.

FIG. 15 shows the cleaning conditions and the evaluation results of the embodiment samples Emb18 through Emb23 and the comparison sample Cmp9, and also the cleaning conditions and the evaluation results of the embodiment sample Emb24 and the comparison sample Cmp10 which will be described later.

In the case of the embodiment samples Emb18 through Emb23 and the comparison sample Cmp9, the via layer 32 and the interconnection layer 34 shown in FIG. 6 were formed by a spin coater using the NCS (product name, manufactured by Catalysts & Chemicals Ind. CO., LTD.). An aqueous solution having 3 wt. % oxalic acid was used for the cleaning liquid. In addition, the resistivity of the carbon dioxide aqueous solution and the pH of the hydrogen aqueous solution were set as shown in FIG. 15.

The number of foreign particles was zero (0) and no interconnection pattern damage was observed for the embodiment samples Emb18 through Emb23. From the embodiment samples Emb18 through Emb20, it was found that the resistivity of the carbon dioxide aqueous solution is preferably set in the range of 0.01 M$\Omega$·cm to 1 M$\Omega$·cm. From the embodiment samples Emb18, Emb21 and Emb22, it was found that the pH of the hydrogen aqueous solution is preferably set in a range of 7 to 9.8.

In the case of the embodiment sample Emb23, no ultrasonic waves were applied when supplying the hydrogen aqueous solution to the surface of the wafer structure when carrying out the cleaning using the hydrogen aqueous solution. In this case, the number of foreign particles, the damage of the interconnection pattern and the via chain yield for the embodiment sample Emb23 were similar to those of the embodiment sample Emb22 for which the ultrasonic waves were applied when supplying the hydrogen aqueous solution, and thus found to be satisfactory. Therefore, it was found that the cleaning using the hydrogen aqueous solution has a high cleaning performance when removing the foreign particles, even if a physical action such as the application of the ultrasonic waves is not taken. Therefore, it may be expected that the cleaning using the hydrogen aqueous solution is also applicable to the cleaning of the low-k layer which has a low mechanical strength and could not be sufficiently cleaned by conventional methods.

The conventional two-fluid cleaning was carried out for the comparison sample Cmp9 in place of the cleaning using the hydrogen aqueous solution. The number of foreign particles, the damage of the interconnection pattern and the via chain yield for the comparison sample Cmp9 were poor compared to those of the embodiment samples Emb18 through Emb23. Therefore, it was found that the cleaning process used for the embodiment samples Emb18 through Emb23 has a higher cleaning capacity (or performance) than the conventional two-fluid cleaning, and that a semiconductor device having a high reliability can be produced because the cleaning process does not damage the via layer and the interconnection layer which are made of the NCS (product name, manufactured by Catalysts & Chemicals Ind. CO., LTD.).

Embodiment Sample Emb24 & Comparison Sample Cmp10

The via layer 32 shown in FIG. 6 was formed by plasma CVD using silicon oxide (SiO) for the embodiment sample Emb24 and the comparison sample Cmp10. Otherwise, the embodiment sample Emb24 and the comparison sample Cmp10 were formed similarly to the embodiment samples Emb18 through Emb23 under similar cleaning conditions. However, the conventional two-fluid cleaning was carried out for the comparison sample Cmp10 in place of the cleaning using the hydrogen aqueous solution.

Silicon oxide (SiO) having a mechanical strength, such as the elastic modulus, higher than that of the NCS (product name, manufactured by Catalysts & Chemicals Ind. CO., LTD.) was used for the via layer 32 of the comparison sample Cmp10. However, damage of the interconnection pattern was observed for the comparison sample Cmp10. In addition, the via chain yield of the comparison sample Cmp10 was considerably poorer than that of the embodiment sample Emb24. Therefore, it was also found from this comparison that the cleaning using the hydrogen aqueous solution is considerably improved compared to the conventional two-fluid cleaning.

The cleaning process of the method of producing semiconductor device in the embodiment described above is of course similarly applicable to the production of other semiconductor devices, and both the via layer and the interconnection layer may be made of silicon oxide (SiO).

According to the embodiment described above, it is possible to produce semiconductor devices capable of performing high-speed operations and having a high reliability.

Further, the present invention is not limited to these embodiments, but various variations and modifications may be made without departing from the scope of the present invention.

What is claimed is:

1. A method of producing a semiconductor device having an interconnection structure disposed above a substrate, said interconnection structure comprising an interconnection and an insulator layer including a low-permittivity layer, said method comprising:
    forming openings in the insulator layer to expose a surface of the interconnection by a dry etching;
    cleaning the surface of the interconnection and the openings in the insulator layer; and
    forming another interconnection, after said cleaning, by filling a conductor material into the openings,
    said cleaning including:
        a first cleaning process using a fluorine compound as a first cleaning liquid;
        a rinsing process using a rinsing liquid including water and a carbonic acid or organic acid; and
        a second cleaning process using a neutral or alkaline hydrogen aqueous solution as a second cleaning liquid that is supplied to the surface of the interconnection and the openings in the insulator layer,
        wherein the hydrogen aqueous solution is formed by water into which hydrogen gas is dissolved, and the low-permittivity layer includes silicon.

2. The method as claimed in claim 1, wherein the insulator layer includes a via layer and an interconnection layer that are successively stacked on the interconnection, and the interconnection layer is formed by the low-permittivity layer.

3. The method as claimed in claim 1, wherein the rinsing liquid including the carbonic acid is made of a carbon dioxide aqueous solution having carbon dioxide dissolved into the water.

4. The method as claimed in claim 1, wherein the rinsing liquid including the organic acid is made of an acidic aqueous solution having an acidic organic acid dissolved into water.

5. The method as claimed in claim 1, wherein the rinsing liquid includes the organic acid, and said cleaning further includes another rinsing process, carried out between the rinsing process and the second cleaning process, using water or a carbon dioxide aqueous solution that is supplied to the surface of the interconnection and the openings in the insulator layer.

6. The method as claimed in claim 1, wherein the rinsing liquid has a resistivity in a range of 0.01 MΩ·cm to 1 MΩ·cm.

7. The method as claimed in claim 1, wherein the neutral or alkaline hydrogen aqueous solution has a pH in a range of 7 to 9.8.

8. The method as claimed in claim 1, wherein the alkaline hydrogen aqueous solution is made of water into which hydrogen is dissolved and to which an alkaline pH regulator is added.

9. The method as claimed in claim 1, wherein the second cleaning process applies ultrasonic waves to the hydrogen aqueous solution.

10. The method as claimed in claim 1, wherein said cleaning rotates the semiconductor device when cleaning.

11. The method as claimed in claim 1, wherein the interconnection is made of a material selected from a group consisting of Cu and Cu alloys having Cu as a main component, said Cu alloys including one of Al, Ag and Au.

* * * * *